(12) United States Patent
Lu et al.

(10) Patent No.: US 10,098,250 B2
(45) Date of Patent: Oct. 9, 2018

(54) ELECTRONIC DEVICE

(71) Applicants: Inventec (Pudong) Technology Corp., Shanghai (CN); Inventec Corporation, Taipei (TW)

(72) Inventors: Chia-Chen Lu, Taipei (TW); Chun-Ying Yang, Taipei (TW); Hsin-Liang Chen, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 0 days.

(21) Appl. No.: 15/470,852

(22) Filed: Mar. 27, 2017

(65) Prior Publication Data

US 2018/0146568 A1 May 24, 2018

(30) Foreign Application Priority Data

Nov. 21, 2016 (CN) .......................... 2016 1 1055953

(51) Int. Cl.

| H05K 7/00 | (2006.01) |
|---|---|
| H05K 7/14 | (2006.01) |
| H01R 12/72 | (2011.01) |
| H01R 13/516 | (2006.01) |
| H05K 5/00 | (2006.01) |
| G06F 1/18 | (2006.01) |

(52) U.S. Cl.
CPC ............. *H05K 7/1432* (2013.01); *G06F 1/18* (2013.01); *H01R 12/721* (2013.01); *H01R 13/516* (2013.01); *H05K 5/0069* (2013.01); *H05K 7/1461* (2013.01); *H05K 7/1492* (2013.01)

(58) Field of Classification Search
CPC .. H05K 7/1432; H05K 5/0069; H05K 7/1461; H01R 12/721; H01R 13/516
USPC .......................................................... 361/728
See application file for complete search history.

(56) References Cited

U.S. PATENT DOCUMENTS

| 5,469,345 A * | 11/1995 | Pettersen | .................. F21L 4/00 |
| | | | 362/188 |
| 7,839,624 B2 * | 11/2010 | Lin | ......................... G06F 1/184 |
| | | | 361/679.02 |
| 9,179,572 B2 * | 11/2015 | Li | ........................ H05K 7/1487 |
| 9,582,057 B2 * | 2/2017 | Hartman | ............ H05K 7/20836 |
| 9,817,450 B2 * | 11/2017 | Zani | ......................... G06F 1/185 |
| 2007/0025095 A1 * | 2/2007 | Beall | ....................... G06F 1/187 |
| | | | 361/796 |

* cited by examiner

*Primary Examiner* — Hung S Bui
(74) *Attorney, Agent, or Firm* — Winston Hsu

(57) ABSTRACT

An electronic device includes a casing, a first power housing and a second power housing. The casing is equipped with a main board. The first power housing is disposed in the casing. The first power housing has a plurality of engaging portions. The second power housing has a plurality of engaging grooves. Each of the engaging grooves is corresponding to one of the engaging portions. Each of the engaging grooves is L-shaped and has an opening. When the second power housing is disposed on the first power housing and the engaging portion enters the engaging groove through the opening, the second power housing is capable of moving with respect to the first power housing in a horizontal direction, such that the engaging portion is engaged with the engaging groove.

9 Claims, 9 Drawing Sheets

ELECTRONIC DEVICE

BACKGROUND OF THE INVENTION

1. Field of the Invention

The invention relates to an electronic device and, more particularly, to an electronic device equipped with a power housing capable of being assembled or disassembled rapidly and a power expansion card disposed horizontally.

2. Description of the Prior Art

As technology advances and develops, electronic devices (e.g. computer, server and so on) are considered a necessity by a lot of people in their daily lives. To provide various functions for the electronic devices, the electronic devices are always equipped with various electronic components, so as to enhance additional functions. However, as the function of the electronic device is expanded, the power needed by the electronic device increases correspondingly. When the power has to be expanded, the prior art always adds a power expansion card to connect additional power supply. At present, a power housing used for accommodating the power supply is fixed in a casing of the electronic device by screws. It is inconvenient to fix the power housing by screws and the power housing cannot be assembled or disassembled if there is no suitable screw driver. Accordingly, how to assemble or disassemble the power housing rapidly without any tools becomes a significant design issue. Furthermore, since the power expansion card is disposed on a main board vertically, the air flow for dissipating heat will get worse and then the heat dissipating efficiency will be reduced.

SUMMARY OF THE INVENTION

The invention provides an electronic device equipped with a power housing capable of being assembled or disassembled rapidly and a power expansion card disposed horizontally, so as to solve the aforesaid problems.

According to an embodiment of the invention, an electronic device comprises a casing, a first power housing and a second power housing. The casing is equipped with a main board. The first power housing is disposed in the casing. The first power housing has a plurality of engaging portions. The second power housing has a plurality of engaging grooves. Each of the engaging grooves is corresponding to one of the engaging portions. Each of the engaging grooves is L-shaped and has an opening. The second power housing is capable of moving with respect to the first power housing in a horizontal direction when the second power housing is disposed on the first power housing and the engaging portion enters the engaging groove through the opening, such that the engaging portion is engaged with the engaging groove.

In this embodiment, the electronic device further comprises a power expansion card connected to the second power housing.

In this embodiment, the power expansion card is parallel to the main board when the second power housing is disposed on the first power housing and the power expansion card is connected to the second power housing.

As mentioned in the above, the invention utilizes the engaging portions and the engaging grooves to detachably dispose the second power housing on the first power housing. A user can assemble or disassemble the second power housing easily without any tools by moving the second power housing in the horizontal direction. Furthermore, since the power expansion card is parallel to the main board (i.e. the power expansion card is disposed horizontally with respect to the main board), the resistance to the air flow for dissipating heat can be reduced and then the heat dissipating efficiency can be enhanced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
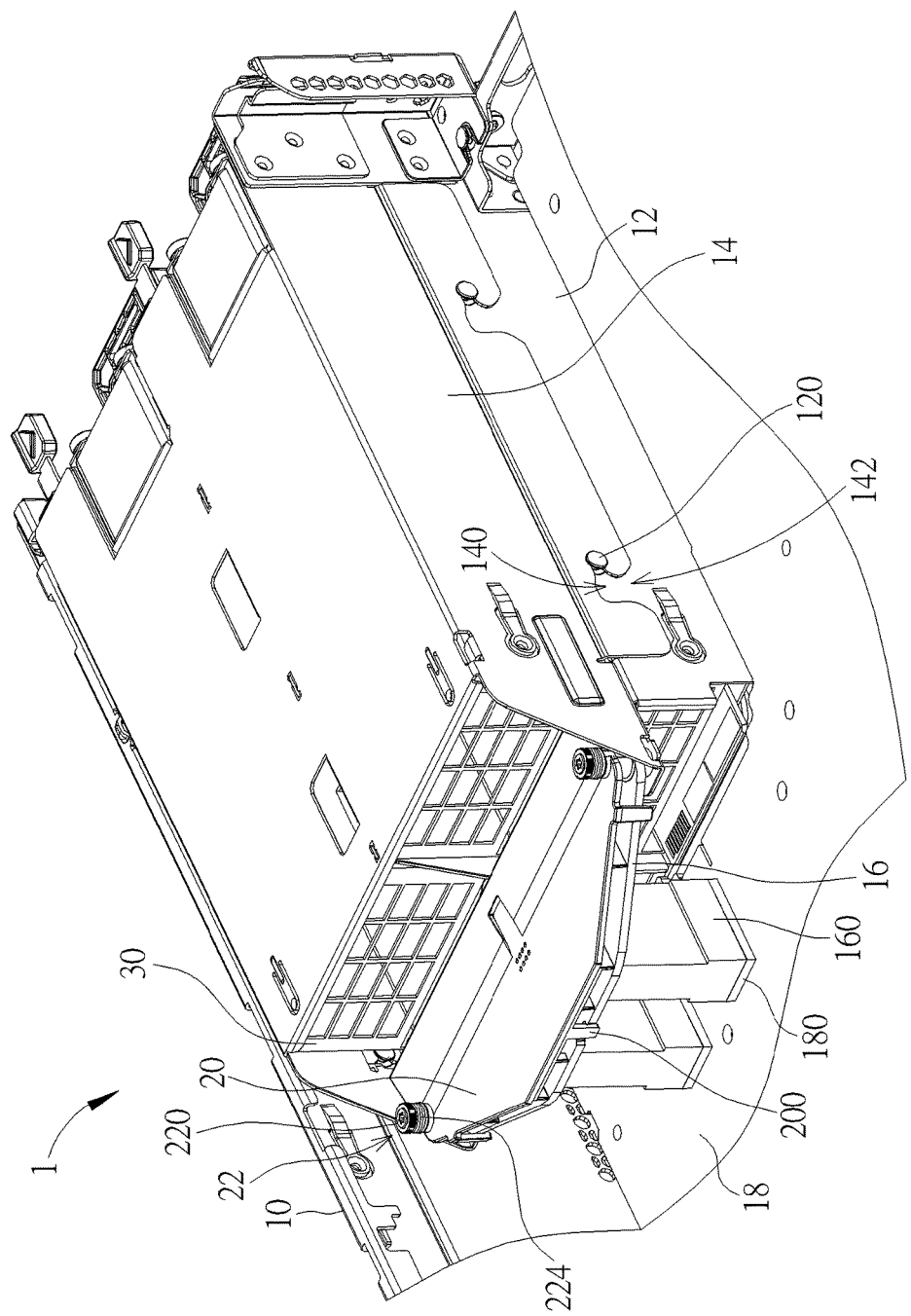
FIG. 1 is a perspective view illustrating an electronic device according to an embodiment of the invention.
Figure 2:
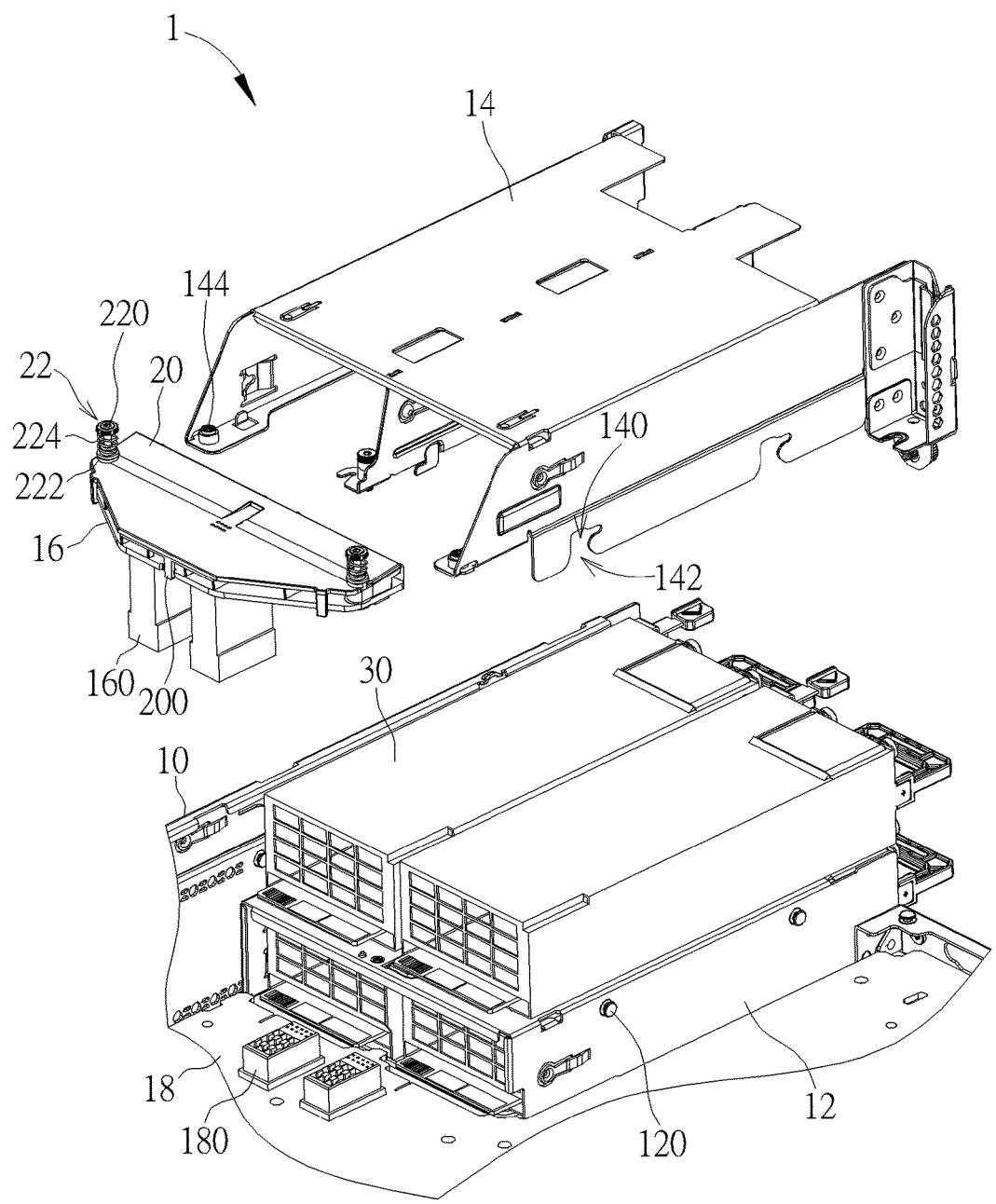
FIG. 2 is an exploded view illustrating the electronic device shown in FIG. 1.
Figure 3:
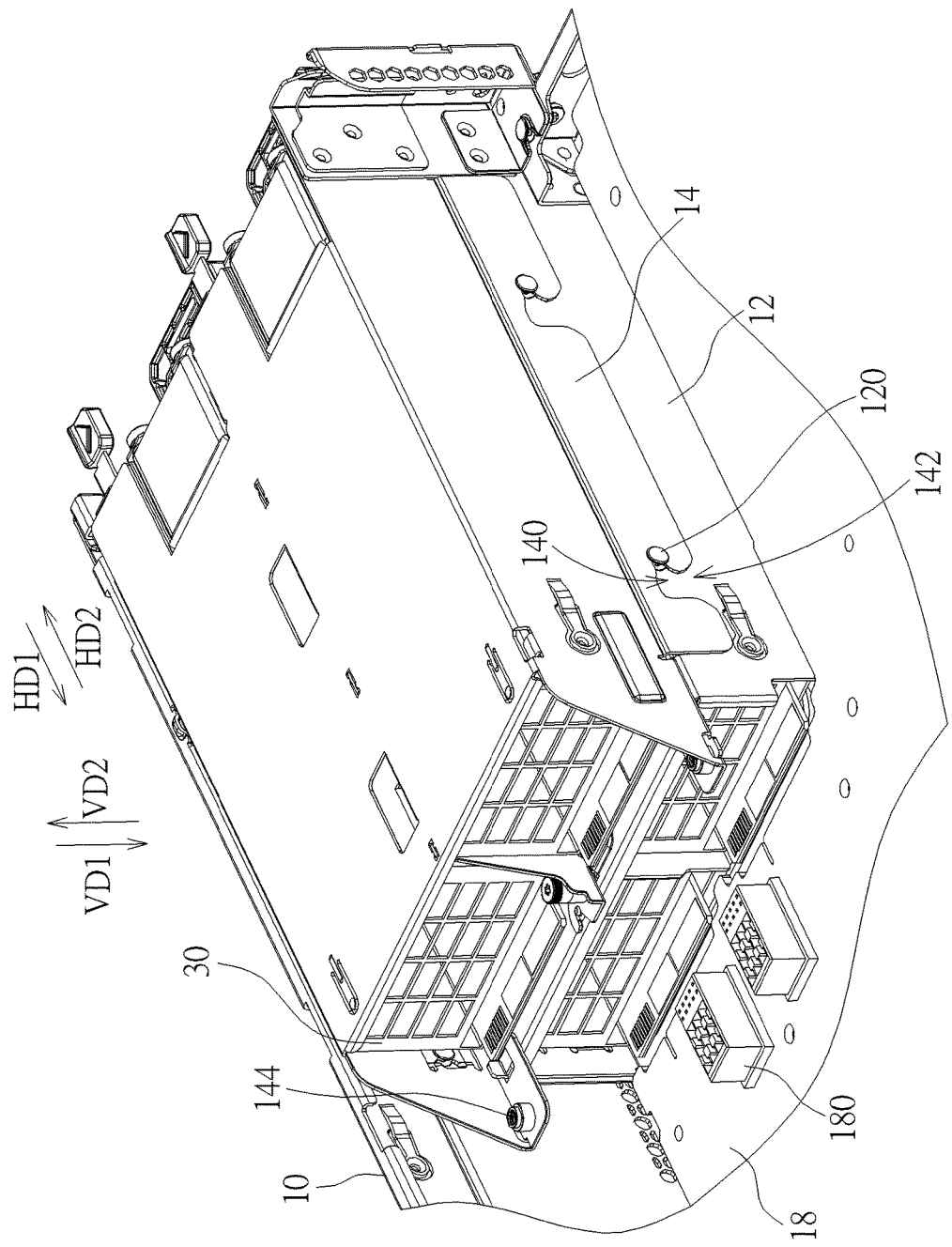
FIG. 3 is an assembly view illustrating the second power housing and the first power housing shown in FIG. 2.
Figure 4:
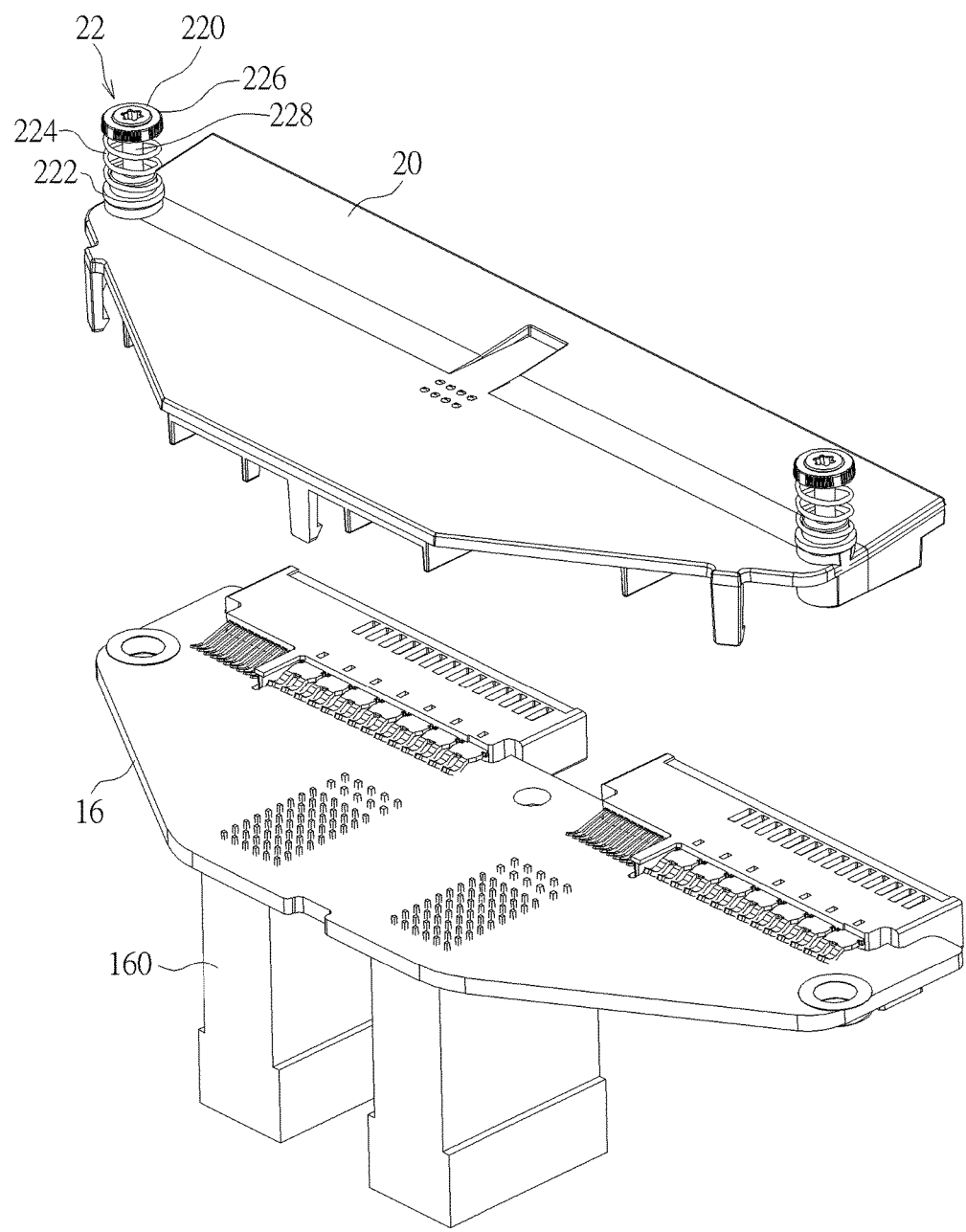
FIG. 4 is an exploded view illustrating the power expansion card and the protection cover shown in FIG. 2.
Figure 5:
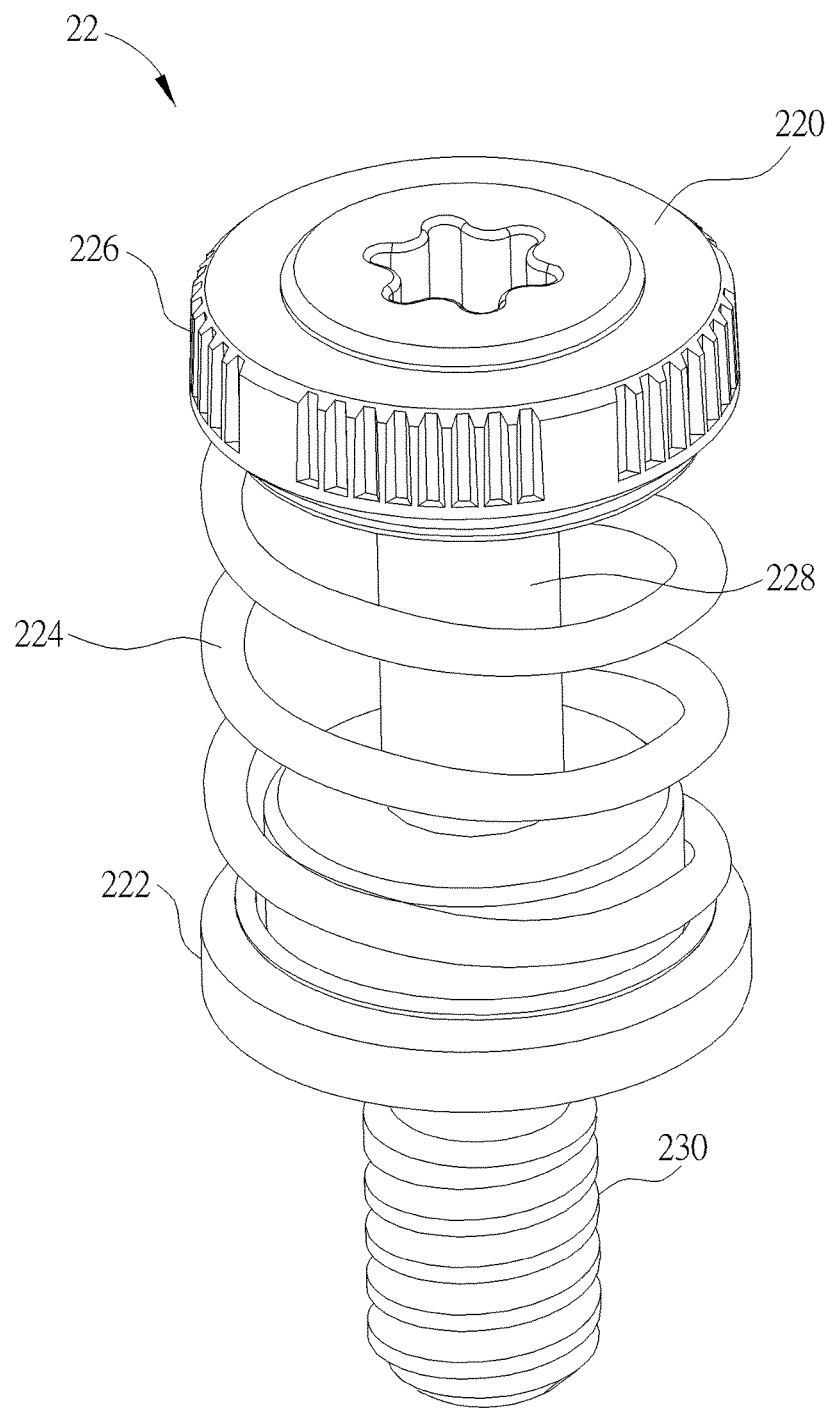
FIG. 5 is a perspective view illustrating the fixing module shown in FIG. 4.
Figure 6:
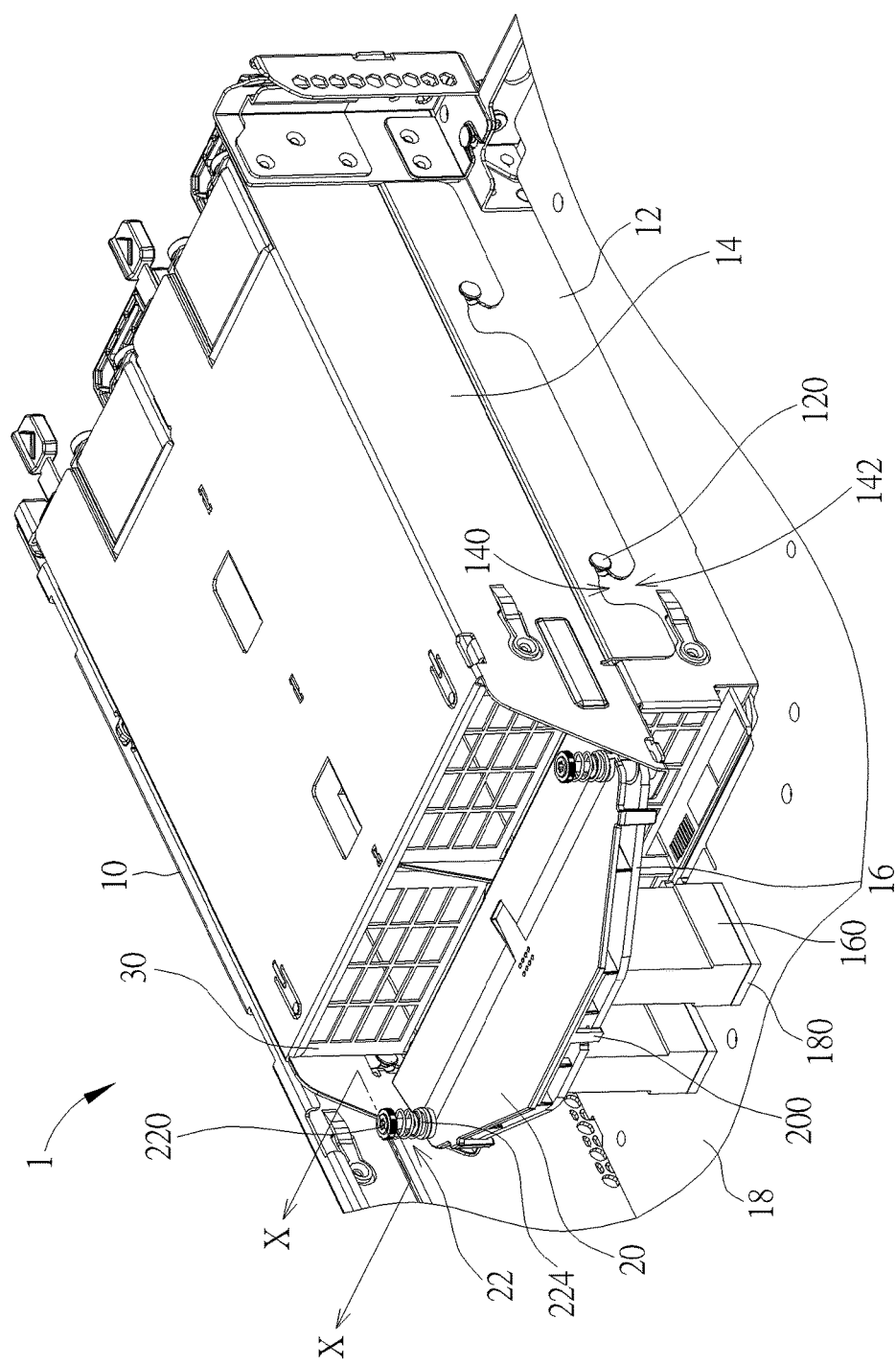
FIG. 6 is a perspective view illustrating the screw shown in FIG. 1 before being screwed.
Figure 7:
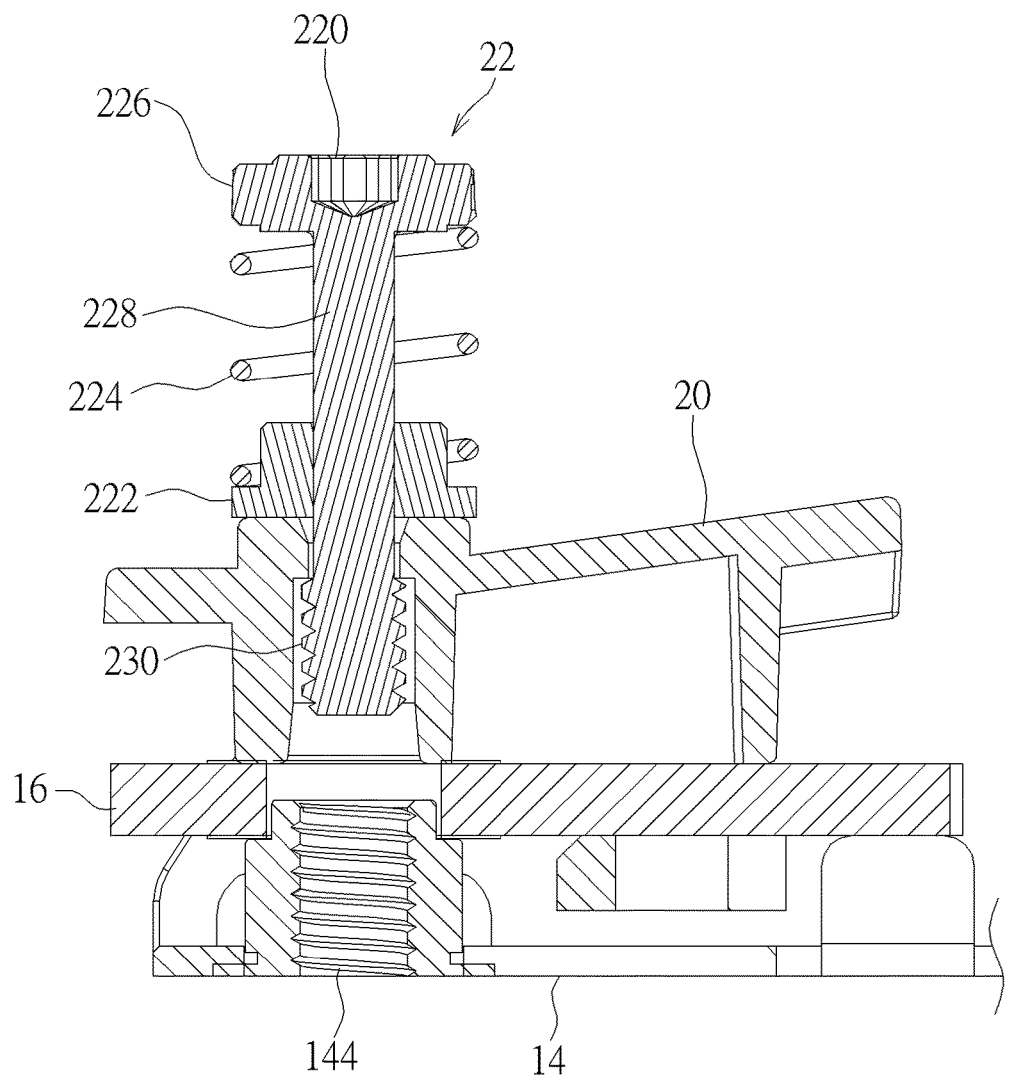
FIG. 7 is a sectional view illustrating the electronic device shown in FIG. 6 along line X-X.
Figure 8:
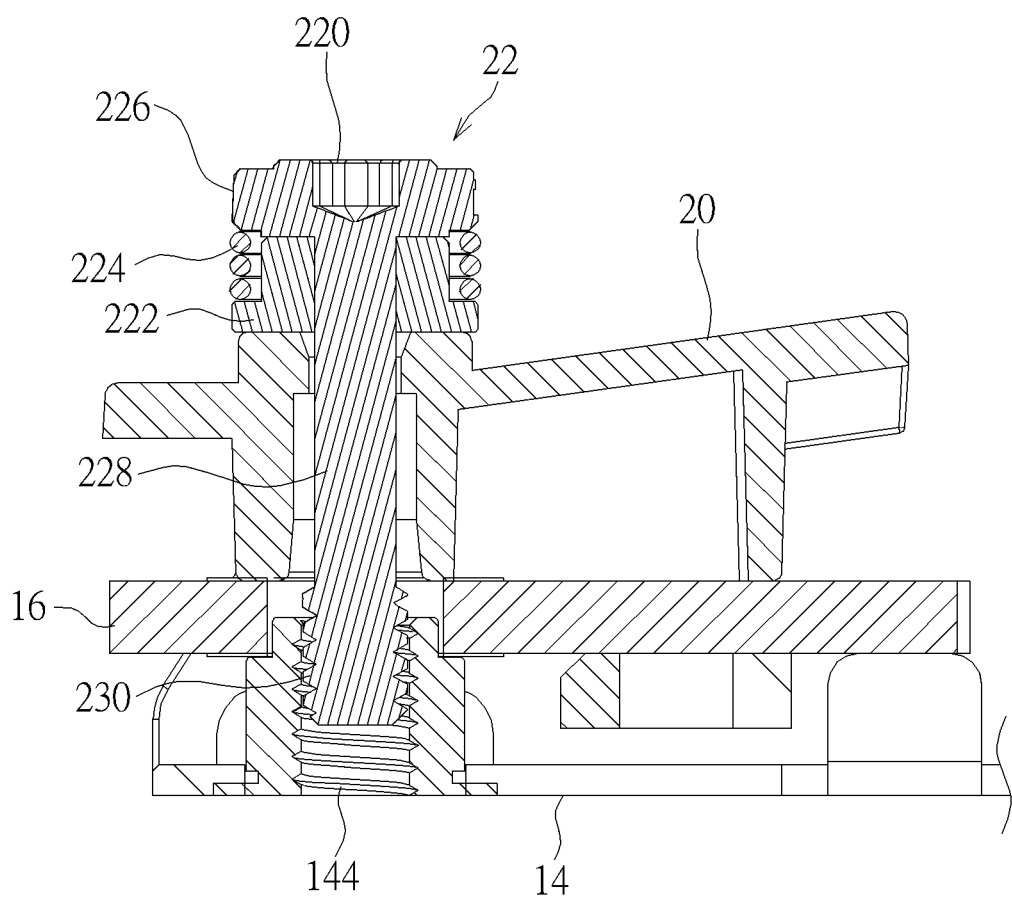
FIG. 8 is a sectional view illustrating the screw shown in FIG. 7 after being screwed.

Referring to FIGS. 1 to 8, FIG. 1 is a perspective view illustrating an electronic device 1 according to an embodiment of the invention, FIG. 2 is an exploded view illustrating the electronic device 1 shown in FIG. 1, FIG. 3 is an assembly view illustrating the second power housing 14 and the first power housing 12 shown in FIG. 2, FIG. 4 is an exploded view illustrating the power expansion card 16 and the protection cover 20 shown in FIG. 2, FIG. 5 is a perspective view illustrating the fixing module 22 shown in FIG. 4, FIG. 6 is a perspective view illustrating the screw 220 shown in FIG. 1 before being screwed, FIG. 7 is a sectional view illustrating the electronic device 1 shown in FIG. 6 along line X-X, and FIG. 8 is a sectional view illustrating the screw 220 shown in FIG. 7 after being screwed.

As shown in FIGS. 1 and 2, the electronic device 1 comprises a casing 10, a first power housing 12, a second power housing 14, a power expansion card 16, a main board 18, a protection cover 20 and two fixing modules 22. It should be noted that the casing 10 shown in FIGS. 1 and 2 is only a part of a complete casing of the electronic device 1. In practical applications, the electronic device 1 may be a computer, a server or other electronic devices.

The first power housing 12 is disposed in the casing 10 and the first power housing 12 has a plurality of engaging portions 120. The second power housing 14 has a plurality of engaging grooves 140 and each of the engaging grooves 140 is corresponding to one of the engaging portions 120. In this embodiment, each of the engaging grooves 140 is L-shaped and has an opening 142.

When a user wants to assemble the second power housing 14 with the first power housing 12, the user can dispose the second power housing 14 on the first power housing 12 in a vertical direction VD1 (as shown in FIG. 3) and make the engaging portion 120 to enter the engaging groove 140 through the opening 142. When the second power housing 14 is disposed on the first power housing 12 and the engaging portion 120 enters the engaging groove 140 through the opening 142, the user can move the second power housing 14 with respect to the first power housing 12 in a horizontal direction HD1 (as shown in FIG. 3), such that the engaging portion 120 is engaged with the engaging groove 140. When the user wants to disassemble the second power housing 14 from the first power housing 12, the user can move the second power housing 14 with respect to the first power housing 12 in a horizontal direction HD2 (as shown in FIG. 3) first and then move the second power housing 14 in a vertical direction VD2 (as shown in FIG. 3), so as to disengage the engaging portion 120 from the engaging groove 140 through the opening 142. Accordingly, the second power housing 14 can be assembled or disassembled easily without any tools.

In this embodiment, the second power housing 14 is used for accommodating a power supply 30. When the power has to be expanded, the user can assemble the second power housing 14 with the first power housing 12, so as to utilize the second power housing 14 to accommodate the power supply 30. On the other hand, when the power has not to be expanded, the user can disassemble the second power housing 14 from the first power housing 12.

The power expansion card 16 is connected to the second power housing 14 and the protection cover 20 is disposed on the power expansion card 16. In this embodiment, the protection cover 20 has a plurality of engaging hooks 200. When the protection cover 20 is disposed on the power expansion card 16, the engaging hooks 200 are engaged with a periphery of the power expansion card 16. The protection cover 20 can prevent the user from contacting the power expansion card 16 directly, so as to avoid the risk of electric shock.

In this embodiment, the power expansion card 16 is connected to the second power housing 14 by two fixing modules 22. As shown in FIG. 5, the fixing module 22 comprises a screw 220, a restraining member 222 and a resilient member 224. The screw 220 has a grasping portion 226, an axial portion 228 and a thread portion 230, wherein the axial portion 228 is located between the grasping portion 226 and the thread portion 230. The restraining member 222 is sleeved on the axial portion 228 and restrained by the thread portion 230. The resilient member 224 is sleeved on the axial portion 228 and opposite ends of the resilient member 224 abut against the grasping portion 226 and the restraining member 222, respectively. In this embodiment, the resilient member 224 may be, but not limited to, a spring. The restraining member 222 is disposed on the protection cover 20. The second power housing 14 has a screw hole 144. The thread portion 230 of the screw 220 can be connected to the screw hole 144, such that the power expansion card 16 is connected to the second power housing 14.

The main board 18 is disposed in the casing 10. The main board 18 has at least one first connector 180 and the power expansion card 16 has at least one second connector 160. In this embodiment, the main board 18 has two first connectors 180 and the power expansion card 16 has two second connectors 160. The first connector 180 and the second connector 160 can be connected to each other, so as to form a signal transmission path.

After disposing the second power housing 14 on the first power housing 12, the user can utilize the fixing module 22 to connect the power expansion card 26 to the second power housing 14. As shown in FIGS. 7 and 8, the user can press down and rotate the grasping portion 226 of the screw 220, such that the thread portion 230 of the screw 220 is connected to the screw hole 144. Accordingly, the power expansion card 16 with the protection cover 20 can be connected to the second power housing 14. At this time, the resilient member 224 is compressed. When the user wants to disassemble the second power housing 16, the user can rotate the grasping portion 226 of the screw 220 to disengage the thread portion 230 of the screw 220 from the screw hole 144. When the thread portion 230 of the screw 220 is disengaged from the screw hole 144, the resilient member 224 generates an elastic force to recover the screw 220 to the state shown in FIG. 7. Accordingly, the power expansion card 16 can be assembled or disassembled easily without any tools.

As shown in FIG. 1, when the second power housing 14 is disposed on the first power housing 12 and the power expansion card 16 is connected to the second power housing 14, the second connector 160 of the power expansion card 16 is connected to the first connector 180 of the main board 18, so as to form a signal transmission path. At this time, the power expansion card 16 is parallel to the main board 18 (i.e. the power expansion card 16 is disposed horizontally with respect to the main board 18), so the resistance to the air flow for dissipating heat can be reduced and then the heat dissipating efficiency can be enhanced.

Figure 9:
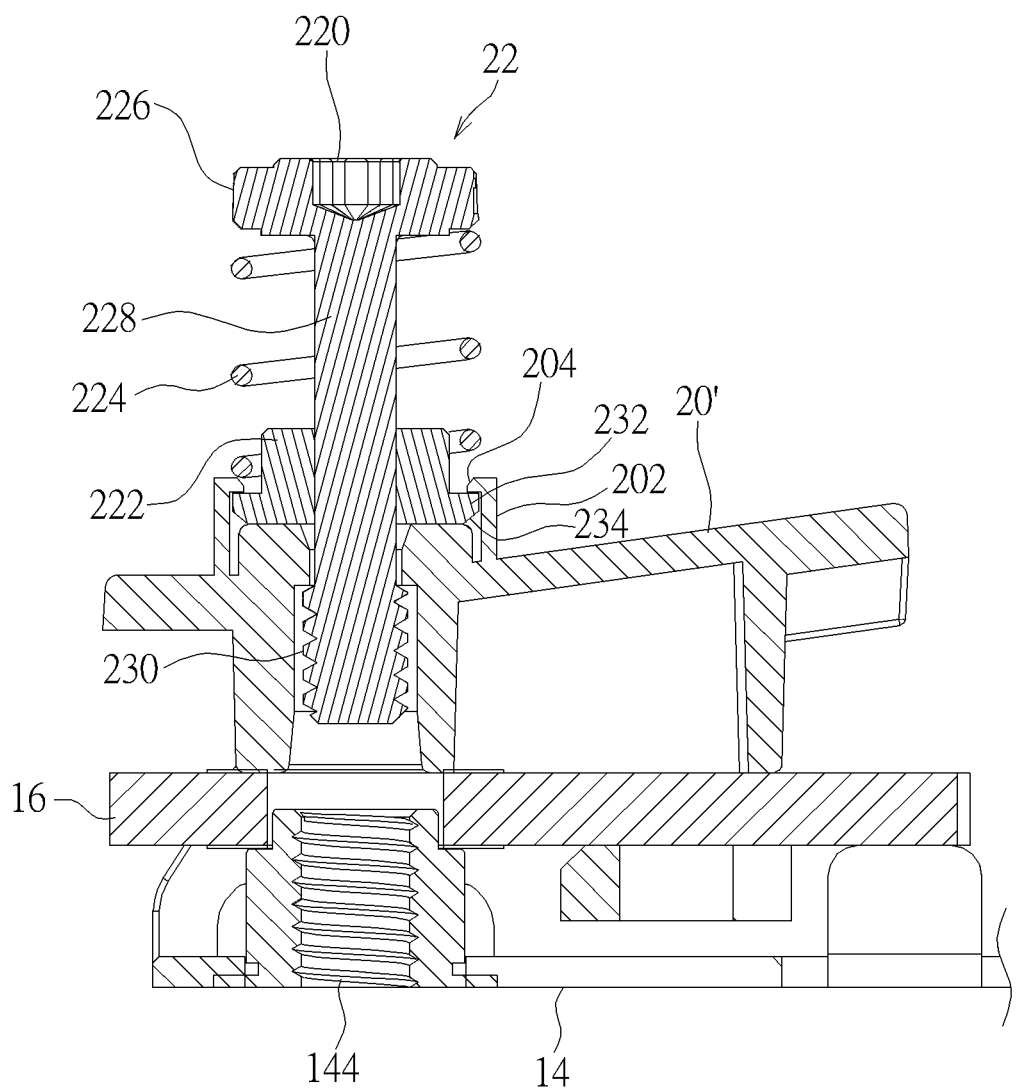
FIG. 9 is a sectional view illustrating a protection cover according to another embodiment of the invention.

Referring to FIG. 9, FIG. 9 is a sectional view illustrating a protection cover 20' according to another embodiment of the invention. As shown in FIG. 9, the protection cover 20' may have a restraining socket 202 and the restraining socket 202 has a plurality of engaging hooks 204. In this embodiment, the restraining socket 202 may be ring-shaped and the restraining socket 202 may have four engaging hooks 204, wherein the four engaging hooks 204 are arranged on a ring-shaped inner surface of the restraining socket 202 symmetrically. Furthermore, the restraining member 222 has a ring-shaped edge 232. The user can press down the ring-shaped edge 232 of the restraining member 222 toward the engaging hooks 204 of the restraining socket 202, so as to engage the ring-shaped edge 232 with the engaging hooks 204. Consequently, the restraining member 222 is fixed in the restraining socket 202. In this embodiment, the ring-shaped edge 232 may have a chamfer 234, so as to facilitate the restraining member 222 to be assembled with the restraining socket 202.

As mentioned in the above, the invention utilizes the engaging portions and the engaging grooves to detachably dispose the second power housing on the first power housing. A user can assemble or disassemble the second power housing easily without any tools by moving the second power housing in the horizontal direction. Furthermore, since the power expansion card is parallel to the main board (i.e. the power expansion card is disposed horizontally with respect to the main board), the resistance to the air flow for dissipating heat can be reduced and then the heat dissipating efficiency can be enhanced. Still further, the user can rotate the screw of the fixing module directly to assemble or disassemble the power expansion card without any tools. Moreover, since the invention disposes the protection cover on the power expansion card, the protection cover can prevent the user from contacting the power expansion card directly, so as to avoid the risk of electric shock.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An electronic device comprising:
   a casing equipped with a main board;
   a first power housing disposed in the casing, the first power housing having a plurality of engaging portions;
   a second power housing having a plurality of engaging grooves, each of the engaging grooves being corresponding to one of the engaging portions, each of the engaging grooves being L-shaped and having an opening; and
   a power expansion card connected to the second power housing;
   wherein the second power housing is capable of moving with respect to the first power housing in a horizontal direction when the second power housing is disposed on the first power housing and the engaging portion enters the engaging groove through the opening, such that the engaging portion is engaged with the engaging groove.

2. The electronic device of claim 1, wherein the power expansion card is parallel to the main board when the second power housing is disposed on the first power housing and the power expansion card is connected to the second power housing.

3. The electronic device of claim 2, wherein the main board has at least one first connector, the power expansion card has at least one second connector, and the second connector is connected to the first connector when the second power housing is disposed on the first power housing and the power expansion card is connected to the second power housing.

4. The electronic device of claim 1, further comprising a protection cover disposed on the power expansion card.

5. The electronic device of claim 4, wherein the protection cover has a plurality of engaging hooks and the engaging hooks are engaged with a periphery of the power expansion card.

6. The electronic device of claim 4, further comprising a fixing module, the fixing module comprising a screw and a restraining member, the screw having a grasping portion, an axial portion and a thread portion, the axial portion being located between the grasping portion and the thread portion, the restraining member being sleeved on the axial portion and restrained by the thread portion, the restraining member is disposed on the protection cover, the second power housing having a screw hole, the thread portion being connected to the screw hole, such that the power expansion card is connected to the second power housing.

7. The electronic device of claim 6, wherein the fixing module further comprises a resilient member sleeved on the axial portion and opposite ends of the resilient member abut against the grasping portion and the restraining member, respectively.

8. The electronic device of claim 6, wherein the protection cover has a restraining socket, the restraining socket has a plurality of engaging hooks, the restraining member has a ring-shaped edge, and the ring-shaped edge is engaged with the engaging hooks, such that the restraining member is fixed in the restraining socket.

9. The electronic device of claim 8, wherein the ring-shaped edge has a chamfer.

* * * * *